United States Patent [19]

Fellows

[11] 4,021,727

[45] May 3, 1977

[54] METHOD OF AN DEVICE FOR NON-DESTRUCTIVE PRESSURE MEASUREMENT OF FLUORESCENT LAMPS

[75] Inventor: Mark Fellows, Cranbury, N.J.

[73] Assignee: North American Philips Corporation, New York, N.Y.

[22] Filed: Dec. 10, 1975

[21] Appl. No.: 639,270

[52] U.S. Cl. .......................... 324/20 R; 324/58.5 A; 315/248; 315/267

[51] Int. Cl.² .................................... G01R 31/024

[58] Field of Search ..... 73/49.3; 324/20 R, 58.5 A; 313/184; 315/248, 267; 178/DIG. 36, DIG. 37

[56] References Cited

UNITED STATES PATENTS 3,742,281  6/1973  McInally ............................ 313/184

Primary Examiner—Rudolph V. Rolinec
Assistant Examiner—Michael J. Tokar
Attorney, Agent, or Firm—Frank R. Trifari; George B. Berka

[57] ABSTRACT

A central portion of the lamp is ionized by a RF field applied between two auxiliary electrodes and the strength of the RF signal resulting between the terminal electrodes of the lamp is measured as an indication of the fill gas pressure.

7 Claims, 1 Drawing Figure

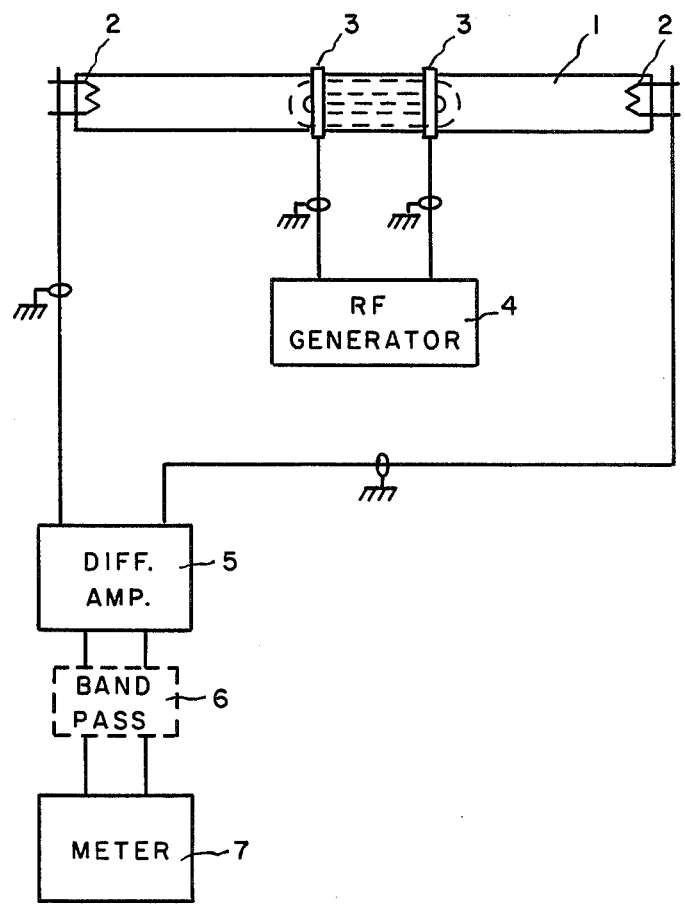

METHOD OF AN DEVICE FOR NON-DESTRUCTIVE PRESSURE MEASUREMENT OF FLUORESCENT LAMPS

This invention relates generally to an indirect measurement of gas pressure in a closed container of insulating material and more specifically it relates to non-destructive pressure measurement of a fill gas in fluorescent lamps.

If it is desired to test the fill gas pressure in a large number of fluorescent lamps, known methods of measuring absolute pressures have the disadvantage that the seal of the lamp has to be broken.

It is accordingly, an object of this invention to avoid this disadvantage by providing a non-destructive pressure measuring process. According to this invention, the above object is obtained by applying a radio frequency field to a central portion of the lamp and measuring either the impedance between the terminal electrodes of the lamp or the strength of radio frequency signal resulting between the two terminal electrodes, as an indication of the fill gas pressure.

The invention will now be described by way of an example in the following detailed description, taken in conjunction with the drawing, in which the single FIGURE shows a device for preforming the method of this invention.

The measuring circuit or device as shown in the FIGURE has been employed for fill gas pressure measurement in fluorescent lamps filled with argon at a pressure between 1.8 to 3.6 Torr. A radio frequency field from generator 4 is applied to a central part of the argon filled bulb 1 by means of two auxiliary electrodes 3 clipped in a spaced relation one to another to the bulb glass wall on either side of the lamp center. The high frequency signal is capacitively coupled through the intermediate glass wall portion, and sets up a glow discharge in the lamp portion between the two auxiliary electrodes 3. It has been found that the ionized gas, in this example argon, has an impedance which is proportional to the gas pressure. It has been also found that due to the high frequency ionization of the gas, a high frequency signal can be picked up from the terminal electrodes 2 of the fluorescent lamp the strength of which is also proportional to the gas pressure. The strength of this picked up signal is preferably measured by placing high impedance (above 10 M Ohms) probes on to the lamp terminal electrodes and differentially passing the resulting signal through a tuned band pass filter 6 and measuring the output wave form on a suitable meter 7 such as an oscilloscope or a high frequency voltmeter. During the measurement, it is important that the discharge be localized between the external or auxiliary electrodes 3; also the employed frequency value of the RF field generated by the generator 4 is very critical, in the given example it has to be about 280 kilocycles.

Having thus described the invention, I wish it to be understood that I do not desire to be limited to the exact details of construction shown and described, for obvious modifications will occur to a person skilled in the art.

What is claimed is:

1. A method of non-destructive pressure measurement of fluorescent lamps comprising the steps of applying a RF field to a central portion of the lamp to ionize the fill gas in the central portion, and measuring the strength of the signal resulting between the terminal electrodes of the lamp as an indication of the fill gas pressure.

2. A method as claimed in claim 1, wherein the impedance resulting between the terminal electrodes is measured as an indication of the fill gas pressure.

3. A method as claimed in claim 1, wherein the RF field is applied between two auxiliary electrodes provided on the lamp wall.

4. A method as claimed in claim 1, wherein the fill gas is argon and the frequency of the applied field is about 280 kHz.

5. A method as claimed in claim 1, wherein the RF signal from the terminal electrodes is amplified in a differential amplifier, and passed through a band pass filter.

6. A device for non-destructive pressure measurement of fluorescent lamps comprising RF generator having shielded probes terminated with auxiliary electrodes adapted for being clamped on the wall of a fluorescent lamp, a differential amplifier having two inputs connected to the terminal electrodes of the lamp and means for measuring the relative strength of the output signal from the amplifier as a indication of the fill gas pressure of the lamp.

7. A device as claimed in claim 6, wherein a tuned band pass filter is connected between the amplifier and the measuring means.

* * * * *